United States Patent [19]

Ruby

[11] Patent Number: 5,780,713
[45] Date of Patent: Jul. 14, 1998

[54] POST-FABRICATION TUNING OF ACOUSTIC RESONATORS

[75] Inventor: Richard C. Ruby, Menlo Park, Calif.

[73] Assignee: Hewlett-Packard Company, Palo Alto, Calif.

[21] Appl. No.: 752,702

[22] Filed: Nov. 19, 1996

[51] Int. Cl.[6] .................................................. C25D 5/00
[52] U.S. Cl. .................................... 73/1.82; 29/25.35
[58] Field of Search .......................... 73/1.82, 1.83; 29/25.35, 594, 407.07, DIG. 16; 310/312; 219/210, 510

[56] References Cited

U.S. PATENT DOCUMENTS

| | | | |
|---|---|---|---|
| 2,806,966 | 9/1957 | Silver | 310/312 |
| 2,808,523 | 10/1957 | Holmbeck | 310/312 |
| 2,816,239 | 12/1957 | Berge | 310/312 |
| 3,818,254 | 6/1974 | Persson | 310/8.1 |
| 4,547,648 | 10/1985 | Longeway | |
| 5,138,214 | 8/1992 | Nakai et al. | 310/312 |
| 5,235,135 | 8/1993 | Knecht et al. | 174/52.3 |
| 5,347,138 | 9/1994 | Aqui et al. | 250/573 |
| 5,641,391 | 6/1997 | Hunter et al. | |

*Primary Examiner*—Robert Raevis
*Attorney, Agent, or Firm*—Thomas X. Li

[57] ABSTRACT

A system is described that tunes the resonance frequency of a thin film acoustic resonator to a desired frequency after the resonator is fabricated. The resonator has a metal layer in an acoustic path of the resonator. The system includes a substantial vacuum reaction chamber within which the resonator is located. A heater is provided that heats the metal layer to an elevated temperature to either grow or etch the metal layer depending on a reaction gas introduced into the reaction chamber. A control circuit is also provided that controls the heater to heat the metal layer such that the thickness of the metal layer is adjusted to obtain the desired frequency after fabrication of the resonator. Methods of tuning the resonance frequency of the acoustic resonator to the desired frequency are also described.

21 Claims, 15 Drawing Sheets

POST-FABRICATION TUNING OF ACOUSTIC RESONATORS

BACKGROUND OF THE INVENTION

1. Field of the Invention

The present invention pertains to acoustic resonators. More particularly, this invention relates to an arrangement of tuning the resonance frequency of an acoustic resonator to a desired frequency after the resonator has been fabricated.

2. Description of the Related Art

As is known, thin film acoustic resonators are advantageous over the standard crystal resonators in many aspects. One advantage is that a thin film acoustic resonator is much smaller in size than a crystal resonator. This is due to the structural differences of the two types of resonators. Because of the smaller size, a thin film acoustic resonator typically has a smaller thermal mass/capacitance than that of a crystal resonator.

One type of prior art thin film acoustic resonator is a film bulk acoustic resonator (FBAR). The FBAR typically uses bulk longitudinal acoustic waves in thin film piezoelectric (PZ) material. FIGS. 1 through 3 show a typical prior art film bulk acoustic resonator 10 which has a device area 14 (i.e., the hatched area 14 in FIG. 1) and pads 17 and 20 leading to the device area 14. FIG. 4 shows the circuit equivalence of the resonator 10. As can be seen in FIGS. 1 through 3, the resonator 10 includes a PZ layer 11 sandwiched between two metal electrode layers 12 and 13. A thin membrane 16 is sometimes formed below the electrode layer 13. Each of the electrode layers 12 and 13 is connected to one of two pads 17 and 20, respectively. The sandwich structure is suspended in air by supporting the resonator 10 around its perimeter with a substrate (not shown) having a cavity.

When an electric field is created between the two electrode layers 12 and 13 by an electrical voltage applied between the electrode layers 12 and 13, the PZ layer 11 converts some of the electrical energy into mechanical energy in the form of sound waves. The sound waves propagate in the same direction as the electric field and reflect off the electrode/air interface.

At the mechanical resonance, the resonator 10 appears to be an electronic resonator. The mechanical resonance frequency, $f_c$ of the resonator 10 is that for a given phase velocity, $v_\phi$ of sound in the material, the half wavelength of the sound waves propagating in the resonator 10 is equal to the total thickness, d, of the resonator 10.

$$f_c = v_\phi / 2d \qquad Eq.(1)$$

Since the velocity of sound is many orders of magnitude smaller than the velocity of light, the resulting resonator 10 can be quite compact, much smaller than a conventional crystal resonator. For example, resonators for applications in the Ghz range may be constructed with physical dimensions less than 100 μm in diameter and a few μm in thickness. In many instances, it is useful to add a second PZ layer and a third metal layer (not shown in FIG. 2) to the resonator 10. This turns the resonator 10 into a stacked bulk acoustic resonator (SBAR). As is known, a SBAR is a two-port resonator and a FBAR is a one-port resonator.

One disadvantage of such a prior art film bulk acoustic resonator is the inability to tune the resonance frequency of the resonator after the resonator is fabricated. As noted above, the resonance frequency is determined by the thickness of the device area of the resonator. The thickness of the device area of the resonator is determined during fabrication of the resonator. This in turn fixes the resultant resonance frequency of the resonator once the resonator is made. However, due to manufacturing variations in making the resonators, variations in thickness of the device area may occur from device to device. This typically causes the resonance frequency of a resonator to shift from the desired resonance frequency, even if only slightly, thus rendering the device defective and unusable.

SUMMARY OF THE INVENTION

The present invention is to provide an arrangement for tuning the resonance frequency of an acoustic resonator to a desired frequency after the resonator is fabricated.

The present invention is to tune the resonance frequency of a thin film acoustic resonator to a desired frequency using local thermally assisted chemical reaction to selectively add material to or remove material from the acoustic path of the resonator after the resonator is fabricated.

A frequency tuning system is described that tunes the resonance frequency of an acoustic resonator to a desired frequency after the resonator is fabricated. The resonator has a metal layer in an acoustic path of the resonator. The system includes a substantial vacuum reaction chamber within which the resonator is located. A heater is provided that heats the metal layer to an elevated temperature to grow or etch the metal layer depending on a reaction gas introduced into the reaction chamber. A control circuit is also provided that controls the heater to heat the metal layer such that the thickness of the metal layer is adjusted to obtain the desired frequency.

A process of tuning the frequency of the resonator is also described. The process includes a step of introducing the reaction gas having at least a metal element into the substantial vacuum reaction chamber. The metal layer of the resonator is heated to the elevated temperature at which the reaction gas adjacent to the metal layer decomposes to grow the metal layer. The growth of the metal layer is controlled by controlling the amount of heat applied to the metal layer.

Alternatively, a different reaction gas is introduced into the reaction chamber and the metal layer is heated to the elevated temperature at which the reaction gas adjacent to the metal layer reacts with the metal layer to reduce thickness of the metal layer. Again, the reduction of the metal layer is controlled by controlling heating of the metal layer.

Other features and advantages of the present invention will become apparent from the following detailed description, taken in conjunction with the accompanying drawings, illustrating by way of example the principles of the invention.

DETAILED DESCRIPTION OF THE INVENTION

Figure 1:
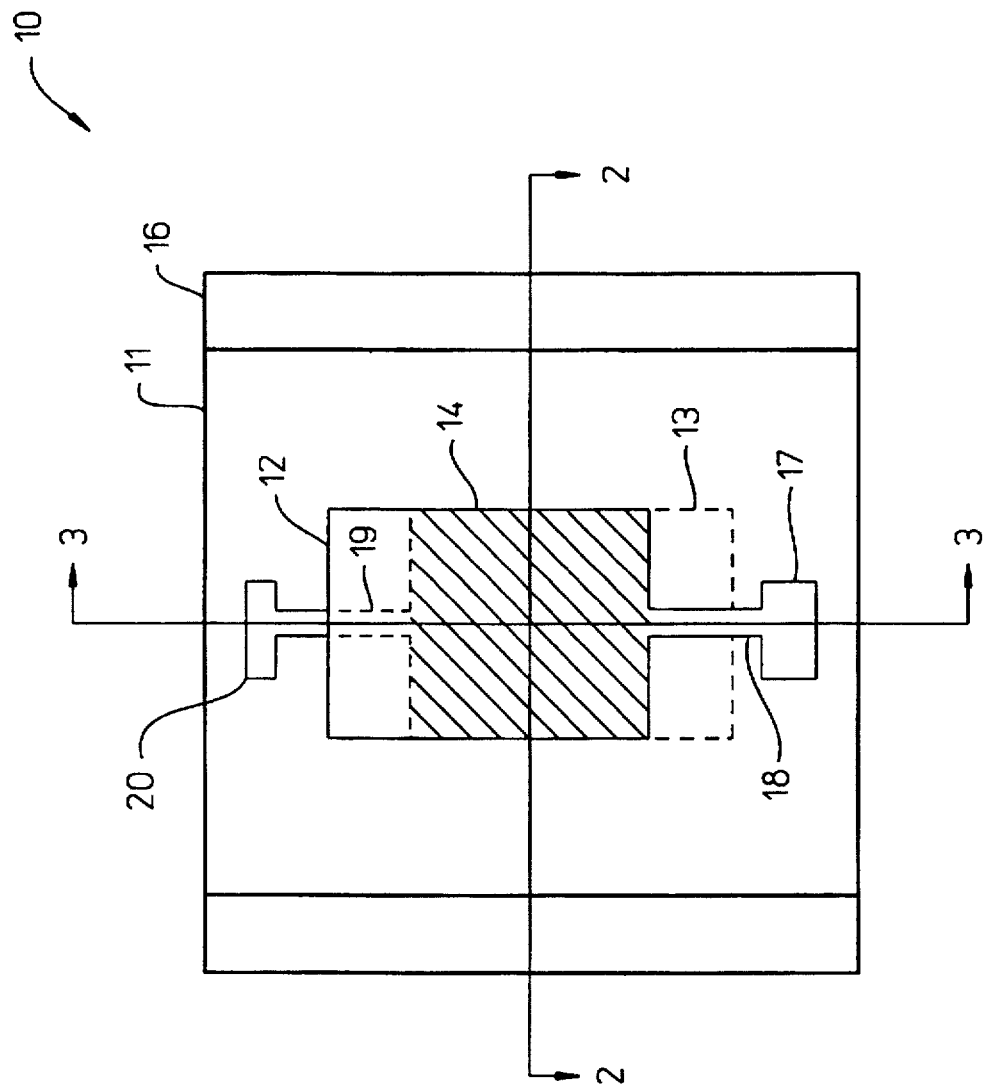
FIG. 1 shows a top view of a prior art film bulk acoustic resonator.
Figure 2:
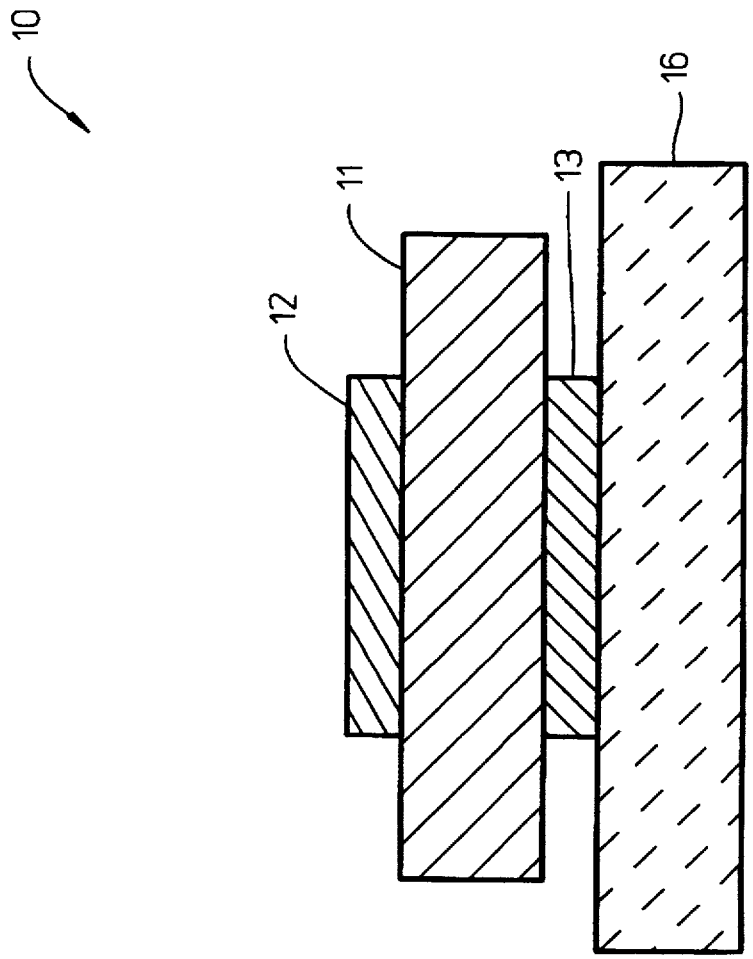
FIG. 2 is one cross-sectional view of the resonator along line 2—2 of FIG. 1.
Figure 3:
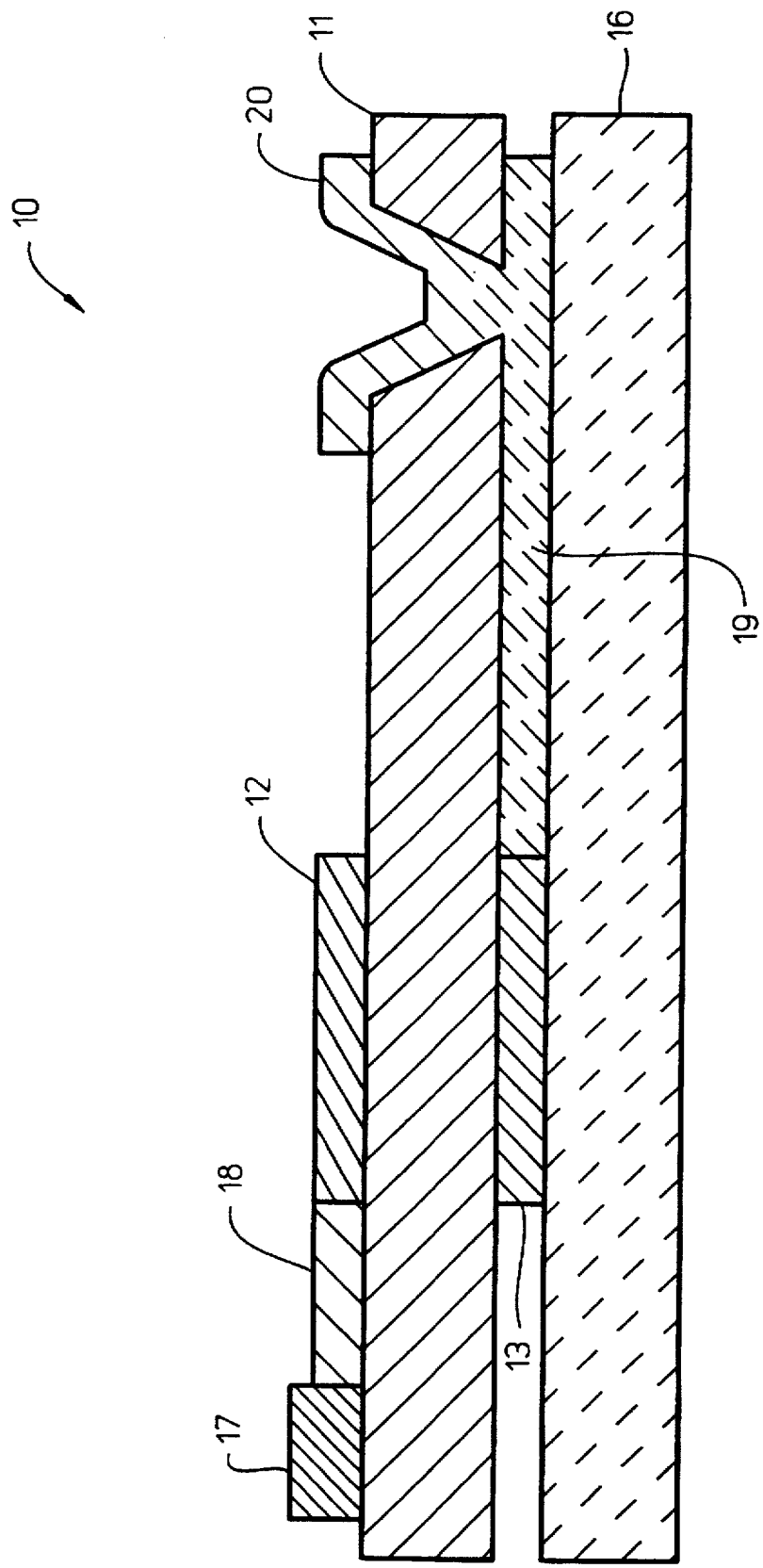
FIG. 3 is another cross-sectional view of the resonator along line 3—3 of FIG. 1.
Figure 4:
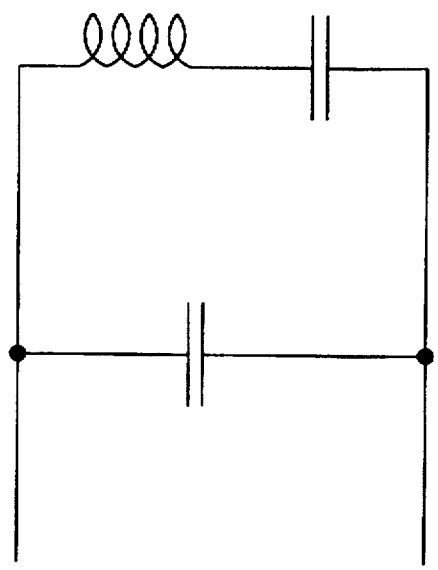
FIG. 4 shows the circuit equivalence of the resonator of FIGS. 1–3.
Figure 5:
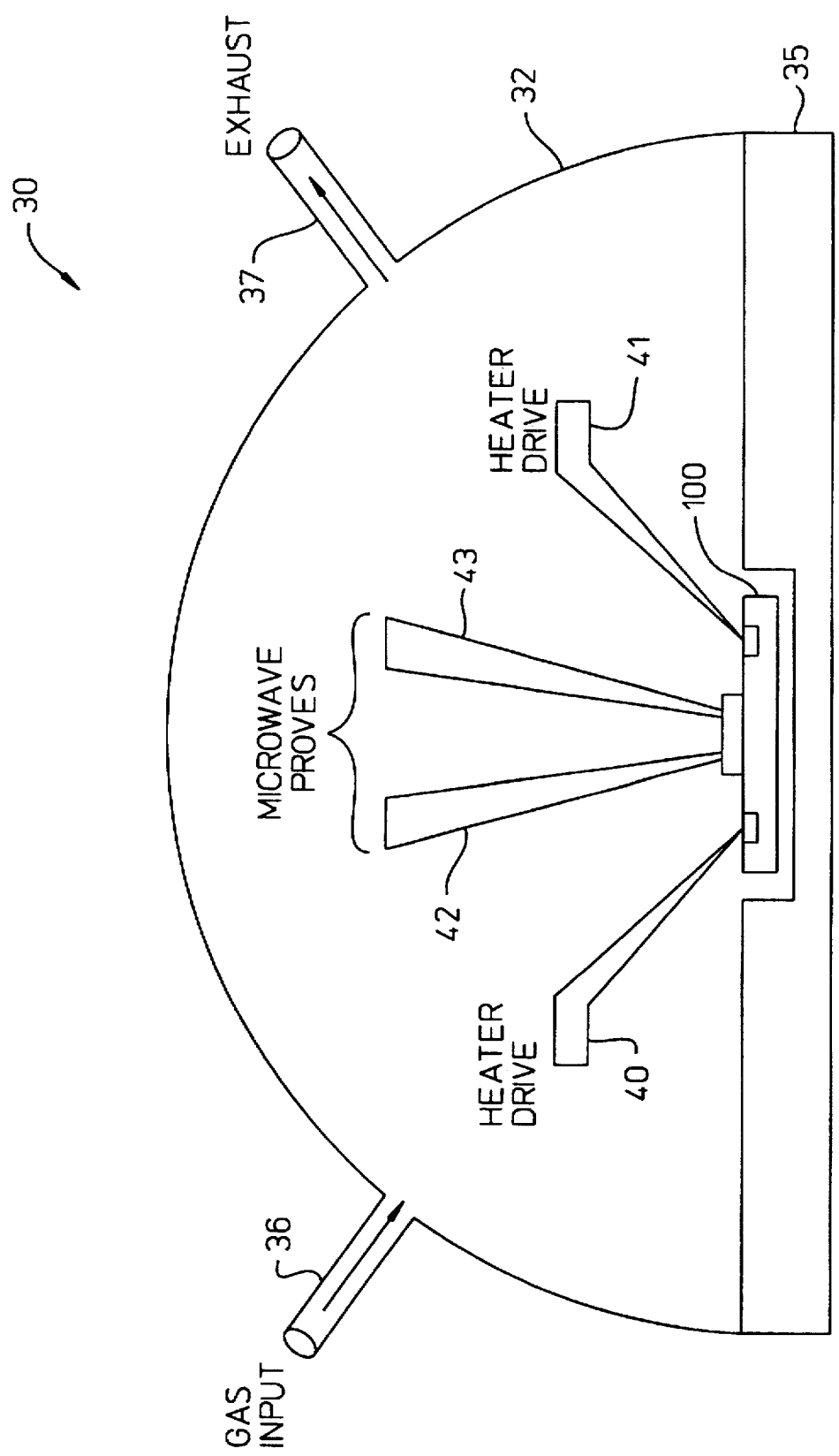
FIG. 5 shows a system of post-fabrication tuning the resonance frequency of an acoustic resonator to a desired frequency in accordance with one embodiment of the present invention.

FIG. 5 shows a system 30 that tunes the resonance frequency of an acoustic resonator 100 to a desired frequency in accordance with one embodiment of the present invention. As will be described in more detail below, the system 30 tunes the resonance frequency of the resonator 100 after the resonator 100 is fabricated. The tuning is achieved by selectively adding material to or removing material from the acoustic path of the resonator 100 through a local thermally-assisted chemical reaction in the system 30. The local thermally-assisted chemical reaction can be either a deposition or an etching reaction that occurs at a locally heated area at the device area 115 (see FIG. 7) of the resonator 100. The local heating is provided by, for example, a pair of built-in resistive heating elements near the device area 115 of the resonator 100 or an external heat source such as a laser. By directing heat towards the device area 115 of the resonator 100, the chemical reaction only causes the thickness of the acoustic path of the resonator 100 to be adjusted and no indiscriminate deposition occurs around the resonator 100 which would otherwise short the entire device 100. It has been found that unlike blanket deposition, temperature conditions do exist for selective deposition on the metal layer, not on the PZ layer and dielectric surface. In this case, various electrical pads are not shorted together as in the case of blanket deposition. The system 30 and the resonator 100 will be described in more detail below.

As shown in FIG. 5, the resonator 100 is tuned in the system 30 after fabrication. In one embodiment, the resonator 100 is a thin film resonator (TFR). In a further embodiment, the resonator 100 is an FBAR. Alternatively, the resonator 100 can be another type of thin film acoustic resonator. For example, the resonator 100 can be a stacked bulk acoustic resonator, a high overtune bulk acoustic resonator, or a solidly mounted resonator. Moreover, the resonator 100 can be other than a thin film acoustic resonator.

As described above, the tuning of the resonator 100 is achieved by selectively adding material to or removing material from the acoustic path of the resonator 100. Thus, it is necessary to first describe the structure of the resonator 100 which is shown in more detail in FIGS. 7–8.

Figure 7:
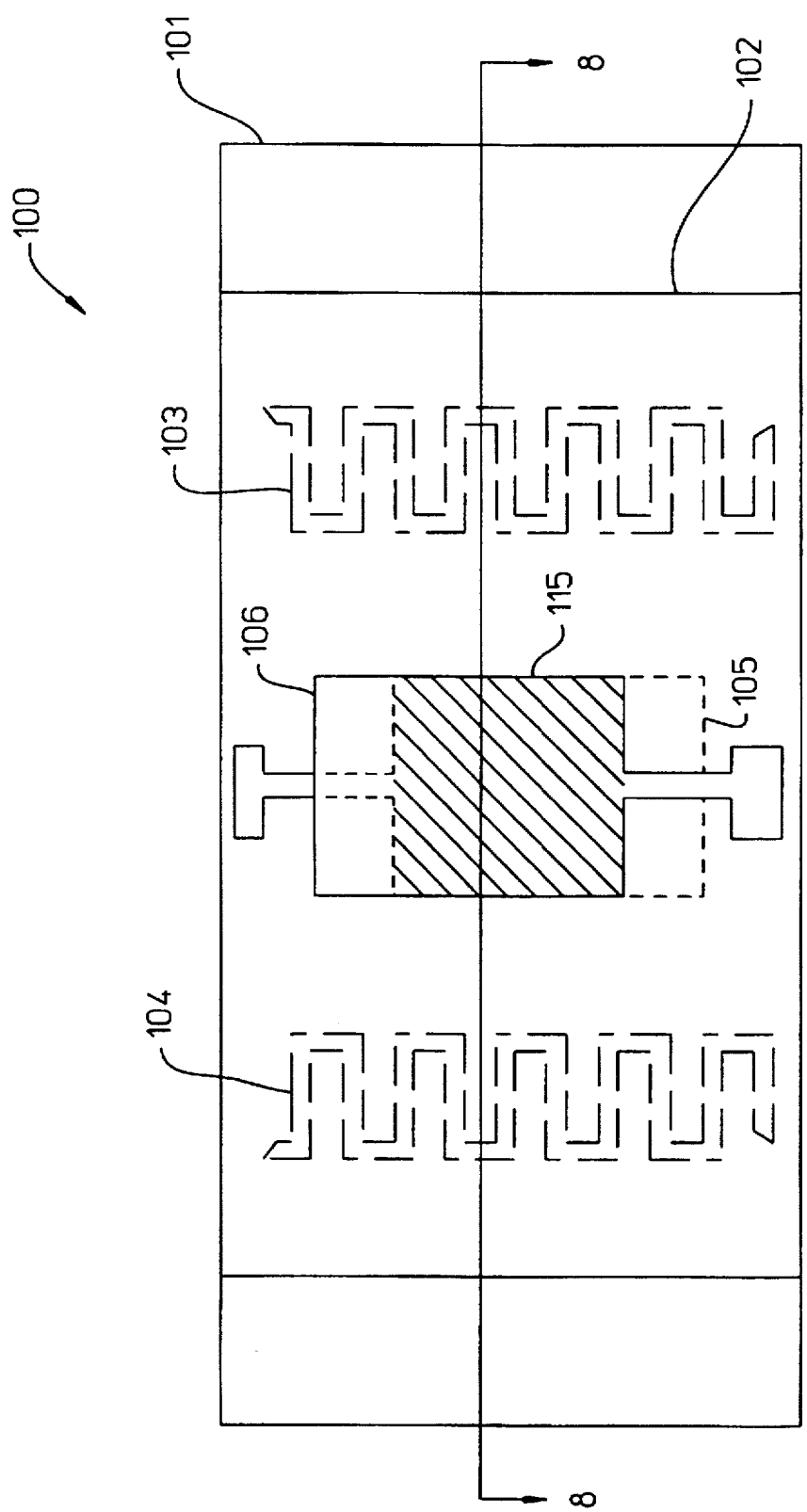
FIG. 7 is a top view of the resonator of FIG. 5, showing that the resonator has a pair of built-in resistive heating elements.
Figure 8:
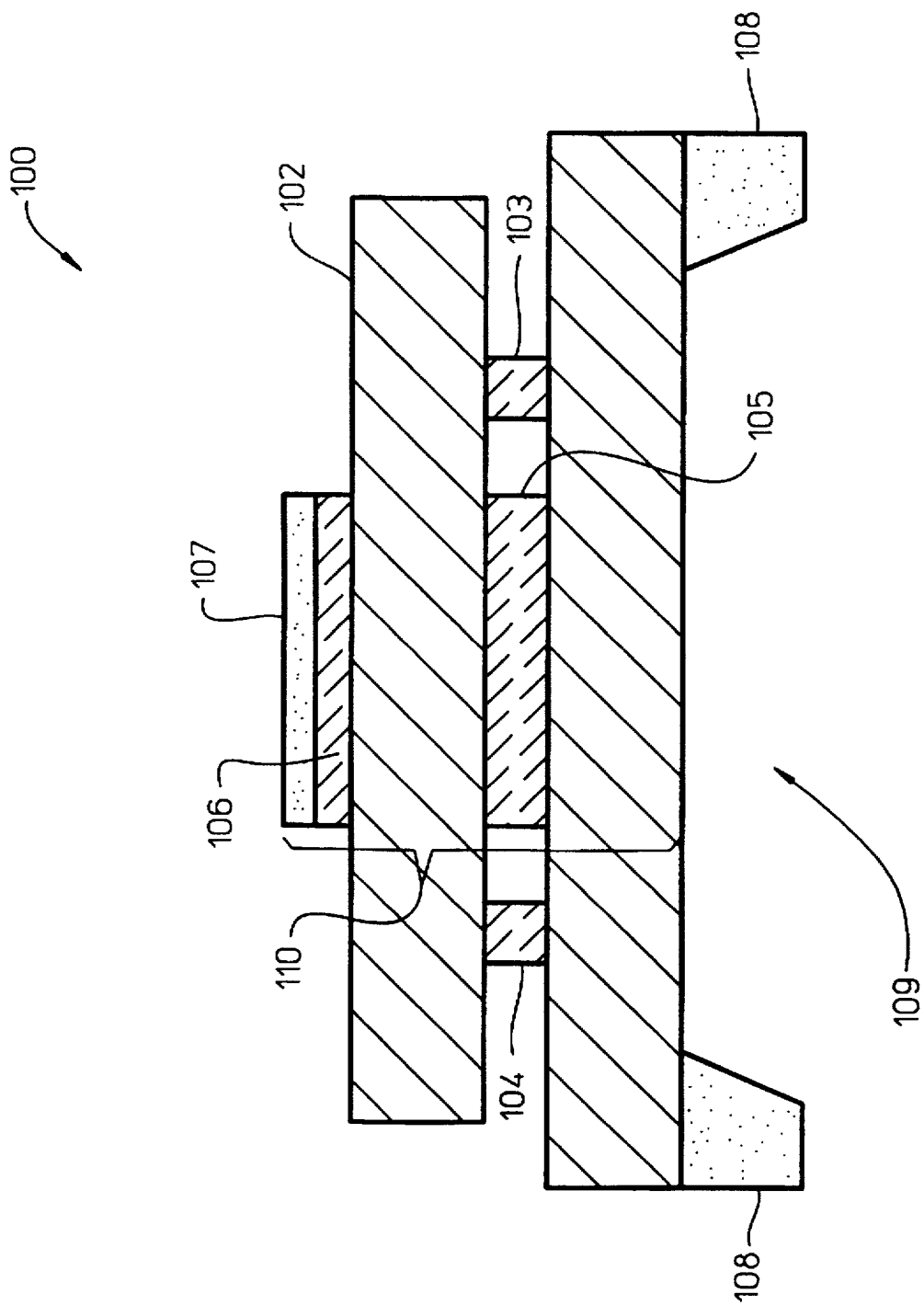
FIG. 8 is a cross-sectional view of the resonator along line 8—8 of FIG. 7, showing the tuning layer of the resonator and the resistive heating elements.

As seen from FIGS. 7–8, the resonator 100 includes bottom and top electrode layers 105 and 106. The electrode layers 105–106 sandwich a portion of a layer of PZ (i.e., piezoelectric) material 102. In some cases, a thin membrane 101 contacts the bottom electrode layer 105. A pair of resistive heating elements 103 and 104 are then sandwiched between the thin membrane 101 and the PZ layer 102. The resonator 100 is then suspended in air by supporting the membrane 101 around its perimeter with a substrate 108 having a cavity 109. The resonator 100 can be fabricated using any known process and means.

In other cases, the thin membrane 101 is not needed. In this case, the PZ layer 102 directly rests on the substrate 108 and the resistive heating elements 103 and 104 are only attached to the PZ layer 102.

In one embodiment, the material for the PZ layer 102 is aluminum nitride (AlN). In alternative embodiments, the PZ layer 102 can be formed by other types of PZ materials. For example, ZnO may be used to form the PZ layer 102.

The electrode layers 105–106 can also be formed by different materials. For example, each of the electrode layers 105–106 can be an aluminum layer, a tungsten layer, a gold layer, a titanium layer, or a molybdenum layer. A preferred element is molybdenum. Alternatively, other metals can be used to form each of the electrode layers 105–106.

It is to be noted that the electrode layers 105 and 106 are part of the acoustic path 110 of the resonator 100. As can be seen from FIG. 8, the acoustic path 110 includes the membrane 101, the PZ layer 102, and the electrode layers 105–106. In addition, the acoustic path 110 also includes a metal tuning layer 107. The metal tuning layer 107 is used to adjust the thickness of the acoustic path 110 of the resonator 100. This is done by adjusting the thickness of the metal tuning layer 107. As is known, the resonance frequency of the resonator 100 is determined by the thickness of the acoustic path 110 of the resonator 100. By adjusting the thickness of the metal tuning layer 107, the thickness of the acoustic path 110 of the resonator 100 is accordingly adjusted such that the resonator 100 can be tuned to the desired resonance frequency (e.g., via Eq.(1) of page (2)).

As will be described in more detail below, the system 30 of FIG. 5 adjusts the thickness of the metal tuning layer 107 after fabrication of the resonator 100. There are two basic ways to adjust the thickness of the metal tuning layer 107. One is to increase the thickness of the metal tuning layer 107 and the other is to decrease the thickness of the metal tuning layer 107. To increase the thickness of the metal tuning layer 107, a deposition reaction is performed by the system 30 of FIG. 5 to grow the metal tuning layer 107. To decrease the thickness of the metal tuning layer 107, an etching reaction is performed by the system 30 of FIG. 5 to reduce the thickness of the metal tuning layer 107. Whether the system 30 performs the deposition reaction or the etching reaction depends on the reaction gas or gases introduced to the reaction chamber 32.

In one embodiment, the metal tuning layer 107 is grown on the electrode layer 106 by the system 30 after the resonator 100 is fabricated. In another embodiment, the metal tuning layer 107 is first formed on the electrode layer 106 during fabrication of the resonator 100. Then the thickness of the metal tuning layer 107 is increased or reduced by the system 30 after the resonator 100 is fabricated.

Various metals can be used to form the metal tuning layer 107. For example, tungsten, aluminum, titanium, molybdenum, platinum, nickel, yttrium, silver, and palladium can be used. The metal tuning layer 107 of the resonator 100 will be described below using tungsten as an example.

In one embodiment, a seed layer of, for example, titanium or tungsten (not shown) is formed on the electrode layer 106 prior to the deposition of the metal tuning layer 107. The seed layer helps increase the adherence of the metal tuning layer 107 to the electrode layer 106.

The resistive heating elements 103–104 of the resonator 100 generate heat when they receive electrical power. As can be seen from FIG. 7, the resistive heating elements 103–104 are located close to the electrode layers 105–106. Because of the low thermal conductivity and low thermal mass of the membrane 101, only a small amount of electrical power (e.g., a few hundred of milliwatts) is required for the resistive heating elements 103–104 to raise the temperature of the electrode layer 106 by hundreds of degrees without heating the entire region (i.e., the pads 17, 20, and the surrounding frame support 108) up. This heating is therefore referred to as local heating. Depending on the electrical power applied to the resistive heating elements 103–104, the elevated temperature can be raised to as high as 600° C.

There are two critical temperature points (i.e., $T_1$ and $T_2$) for the elevated temperature. $T_1$ is the critical temperature point at or above which selective deposition occurs and $T_2$ is the critical temperature point above which blanket deposition occurs. The values of $T_1$ and $T_2$ depend on the materials of the metal electrode layer 106 and the PZ layer 102 and the reactive gas used for the selective deposition, as well as the geometry of the resonator 100. For example, when the PZ layer 102 is made of AlN and the electrode layer 106 is made of molybdenum, it is found that $T_1$ is approximately 150° C. and $T_2$ is approximately 210° C. with the presence of a small amount of $WF_6$.

In one embodiment, $T_1$ is controlled to be approximately between 50° C. and 150° C. and $T_2$ is controlled to be approximately between 200° C. and 350° C. Alternatively, the elevated temperature can have other temperature ranges for the selective deposition. In general, the elevated temperature needs to be high enough such that the chemical reaction can occur and yet low enough not to cause blanket or indiscriminate deposition on the resonator 100. The elevated temperature also depends on the type of reaction gas or gases introduced into the reaction chamber 32 for the thermal assisted chemical reaction.

Referring to FIG. 5, the system 30 that tunes the resonator 100 includes a reaction chamber 32 that has a tray 35 for holding the resonator 100. The reaction chamber 32 is a sealed chamber and is connected to a gas input pipe 36. The gas input pipe 36 is used to introduce a small amount of reaction gas or gases into the reaction chamber 32 for the thermal assisted chemical reaction. It is well known by people skilled in the art that over a finite, subatmospheric pressure range, the average number of layers of gas molecule on a given surface is one. Of course, at a higher pressure, the average number of gas molecular layer may be more than one. As described above, the thermal assisted chemical reaction either increases or decreases the thickness of the metal tuning layer 107 (FIG. 8), depending on the type of the reaction gas introduced into the reaction chamber 32. For example, when the gas mixture introduced into the reaction chamber 32 contains a metal-carrying gas, then the chemical/thermal reaction decomposes a monolayer of the gas, increasing the thickness of the metal tuning layer 107 by a controlled amount. Another gas mixture not containing any metal-carrying molecules, but containing reactive species such as fluorine or chlorine, can be used to reduce the thickness of the metal tuning layer 107. The resistive heating elements 103 and 104 (FIGS. 7 and 8) provide the local heating for the thermal assisted chemical reaction. An exhaust pipe 37 is also connected to the reaction chamber 32. The exhaust pipe 37 serves as an outlet pipe and is connected to a pump (not shown in FIG. 5). The pump provides the vacuum for the reaction chamber 32 via the exhaust pipe 37. In addition, the pump also pumps out exhaustive gas or gases from the reaction chamber 32 via the exhaust pipe 37.

In one embodiment, the reaction chamber 32 is vacuumed or pumped up to approximately 1 torr. Alternatively, the reaction chamber 32 can be vacuumed or pumped up to below 1 torr or above 1 torr. For example, the reaction chamber 32 can be vacuumed to approximately 2 or 3 torr.

In one embodiment, the gas input pipe 36 is connected to a single gas source (not shown in FIG. 5). In another embodiment, the gas input pipe 36 is connected to a manifold (also not shown in FIG. 5). The manifold is used to mix two or more gases together before the gas mixture is injected into the reaction chamber 32.

The gas or gases introduced into the reaction chamber 32 can be selected from a variety of reaction gases. When a deposition reaction is required to increase the thickness of the metal tuning layer 107, the reaction gas introduced into the reaction chamber 32 can be one of a platinum organo-metallic gas, a nickel organo-metallic gas, a yttrium organo-metallic gas, a silver organo-metallic gas, a palladium organometallic gas, and a tungsten hexafluoride ($WF_6$) gas. Alternatively, the reaction gas may be other type of metal-carrying gas.

When the $WF_6$ gas is used for a deposition reaction, a hydrogen ($H_2$) gas is also introduced into the reaction chamber 32 to react with the decomposed fluorine gas. The resultant hydrofluoric (HF) gas is then discharged out of the reaction chamber 32 via the exhaust pipe 37.

In one embodiment, the deposition reaction is a metallographic chemical vapor deposition. Alternatively, the deposition reaction can be performed by other known deposition process.

When an etching reaction is required to decrease the thickness of the metal tuning layer 107, the reaction gas introduced into the reaction chamber 32 can be one of a fluorine ($F_2$) gas, a nitrogen trifluoride ($NF_3$) gas, a carbon tetrafluoride ($CF_4$) gas, a sulphur hexafluoride ($SF_6$) gas, a boron trichloride ($BCl_3$) gas, and a chlorine ($C_2$) gas. Alternatively, the reaction gas can be any other type of reaction gas that, when heated to an elevated temperature, can generate reactive precursors or species which react with metal to form a metal-carrying gas.

The system 30 also includes a pair of heater drives 40 and 41 and a pair of microwave probes 42 and 43. The heater drives 40–41 are connected to the built-in resistive heating elements 103–104 (FIGS. 7–8) of the resonator 100 inside the reaction chamber 32. The heater drives 40–41 are also connected to a pulse generator 51 (shown in FIG. 6) of the system 30. The microwave probes 42–43 are connected to the resonator 100 for probing the resonance frequency of the resonator 100 during the tuning operation. The microwave probes 42–43 are also connected to a frequency measuring circuit 52 (also shown in FIG. 6) of the system 30.

Figure 6:
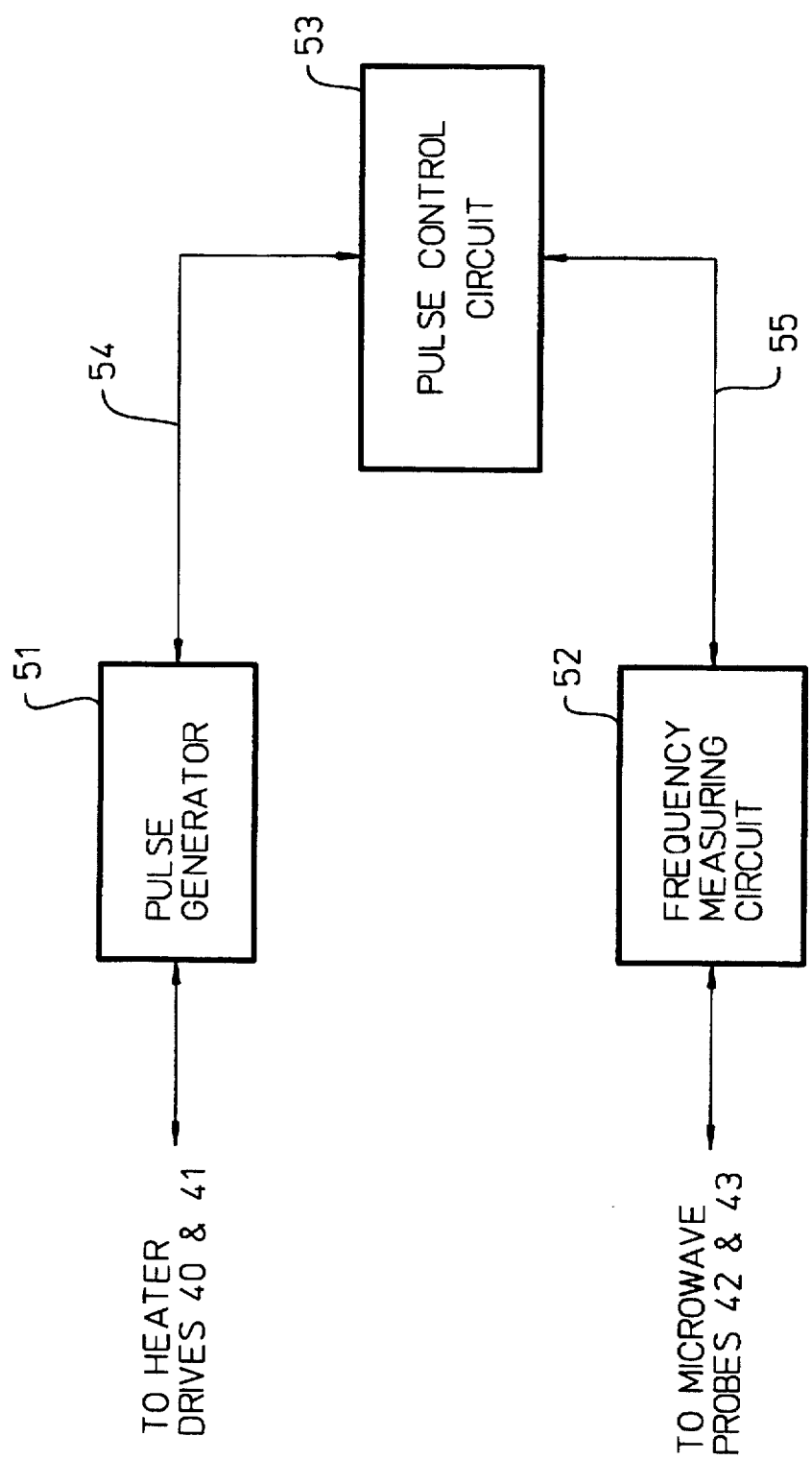
FIG. 6 is a block diagram of some circuits of the system of FIG. 5.

As can be seen from FIG. 6, the frequency measuring circuit 52 is connected to the pulse generator 51 via a pulse control circuit 53. The circuits 51–53 are located, for example, outside the reaction chamber 32 (FIG. 5). Alternatively, these circuits 51–53 can be inside the reaction chamber 32. The pulse generator 51 is used to generate electric pulses of predetermined widths to the resonator 100 via the heater current drives 40–41. The pulses generated by the pulse generator 51 can be either current pulses or voltage pulses. The pulse generator 51 can be implemented by any known pulse generation circuit. The pulse generator 51 is controlled by the pulse control circuit 53 to generate the pulses. The pulse control circuit 53 receives frequency information from the frequency measuring circuit 52 to control the pulse generator 51 to generate the pulses. The frequency measuring circuit 52 measures the resonance frequency of the resonator 100 via the microwave probes 42–43. The measured frequency information is then sent to the pulse control circuit 53. Based on the measured frequency information, the pulse control circuit 53 determines whether pulses are still needed and then controls the pulse generator 51 to do so accordingly. The frequency measuring circuit 52 can be implemented by any known frequency measuring circuit and the pulse control circuit 53 can be implemented by any known control circuit.

Referring now to FIGS. 5–8, during the tuning operation, the resonator 100 is placed in the tray 35 and the reaction chamber 32 is vacuumed. The temperature within the reaction chamber 32 is kept at approximately room temperature. Then a small amount of reaction gas or gases are introduced into the reaction chamber 32. At this time, because the reaction chamber 32 is kept at room temperature, no chemical reaction takes place.

The heater drives 40–41 then contact the resistive heating elements 103–104 and the pulse control circuit 53 controls the pulse generator 51 to apply a pulse to the heating elements 103–104. This heats up the electrode layer 106 and the metal tuning layer 107, if the metal tuning layer 107 has already been formed on the electrode layer 106, to the predetermined elevated temperature. When this occurs, the reaction gas or gases surrounding the electrode layer 106 or the metal tuning layer 107 is heated to cause the chemical reaction. Depending on the type reaction gas or gases introduced into the reaction chamber 32, the chemical reaction is either the deposition reaction that increases the thickness of the metal tuning layer 107 of the resonator 100, or the etching reaction that decreases the thickness of the metal tuning layer 107.

Then the frequency measuring circuit 52 measures the resonance frequency of the resonator 100 using the probes 42–43. If the measured frequency is equal to the desired resonance frequency within a predetermined tolerance value, the tuning is terminated. If the measured frequency is not within the predetermined tolerance value of the desired resonance frequency, the operation is repeated.

Figure 9:
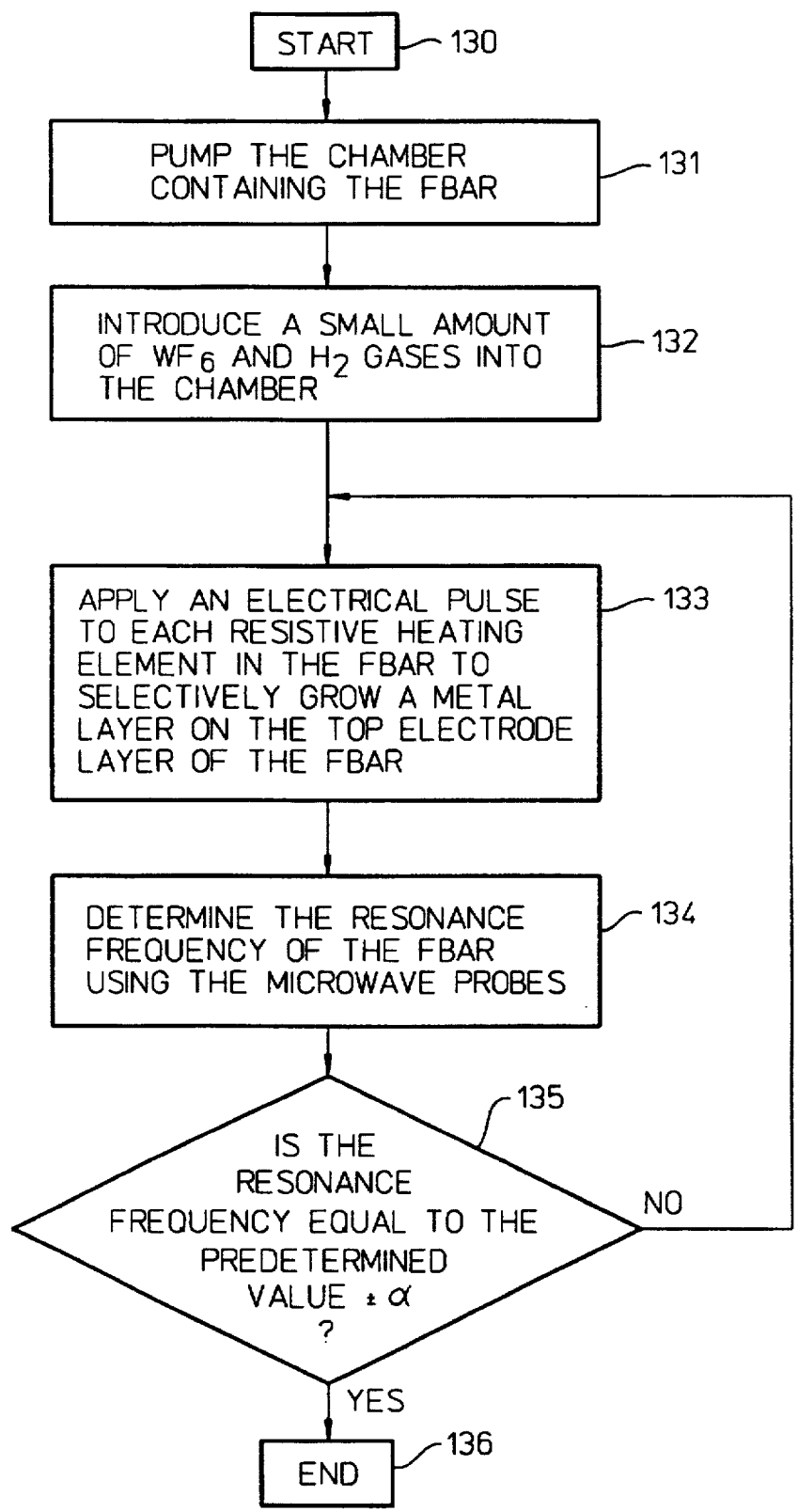
FIG. 9 is a flow chart diagram showing a process of growing the tuning layer by the system of FIG. 5 to tune the resonance frequency of the resonator.

FIG. 9 shows the deposition process of the system 30 to deposit or grow the metal tuning layer 107. The deposition process is now described in more detail below, using $WF_6$ and $H_2$ gases as the reaction gases as an example.

As can be seen from FIG. 9, the process starts at step 130. At step 131, the reaction chamber 32 of the system 30 is vacuumed via the exhaust pipe 37. As described above, the reaction chamber 32 is vacuumed to approximately 1 torr. At step 132, a small amount of $WF_6$ and $H_2$ gases are injected into the reaction chamber 32 via the input pipe 36. At this time, the temperature of the reaction chamber 32 is kept at approximately the room temperature. This causes the $WF_6$ gas not to decompose to deposit tungsten on the inner walls of the reaction chamber 32 or in any wires. As a result, the reaction chamber 32 remains clean and no electrical short occurs to any of the electrical wires or lines inside the reaction chamber 32. In addition, no indiscriminate deposition of tungsten over the entire resonator 100 occurs which would otherwise short the resonator 100.

At step 133, the heater probes 40–41 contact the heating elements 103–104 of the resonator 100 for applying an electrical pulse to each of the resistive heating elements 103–104. When the metal tuning layer 107 has not been formed on the electrode layer 106, the pulse causes the heating elements 103–104 to raise the temperature of the top electrode layer 106 to the elevated temperature (e.g., 100° C.–200° C.) without significantly increasing the temperature of the surrounding areas of the resonator 100.

As a result of the local heating, the $WF_6$ gas surrounding the electrode layer 106 (or the metal tuning layer 107) is heated up to decompose to fluorine atoms and tungsten atoms. It is to be noted that at this time, only the $WF_6$ gas adjacent to the electrode layer 106 starts to decompose and no decomposition of the $WF_6$ gas occurs over the entire resonator 100. This is due to the fact that the resonator 100 is only locally heated around the electrode layers 105–106. Local decomposition of tungsten on the locally heated PZ layer 102 does not occur due to the selectivity of deposition.

The fluorine atoms then react with the hydrogen gas to form the hydrofluoric (HF) gas which is then discharged via the exhaust pipe 37. Meanwhile, the tungsten atoms are deposited onto the electrode layer 106 to form the metal tuning layer 107 or to further grow the metal tuning layer 107.

The metal electrode layer 106 (or the metal tuning layer 107) helps the decomposition of the $WF_6$ gas at a relatively low temperature. Thus the metal electrode layer 106 acts as catalyst to the decomposition.

The appropriate width of the electric pulse applied to the resistive heating elements 103–104 can be determined by measuring the resultant temperature at the electrode layer 106 during tests. The tests are performed prior to the tuning operation. Alternatively, real time monitoring of the change in frequency can be done during deposition.

At step 134, the resonance frequency of the resonator 100 is measured by the frequency measuring circuit 52 using the probes 42–43. At step 135, the frequency measuring circuit 52 determines whether the measured resonance frequency is within a predetermined tolerance a of the desired frequency. If the answer is yes, then the process ends at step 136. If the answer is no, then the system 30 returns to step 133 to repeat the process.

In one embodiment, the $\alpha$ (i.e., tolerance) value can be set at approximately±0.1% of the resonance frequency of the resonator 100. In another embodiment, the $\alpha$ value is set at approximately±1% of the resonance frequency of the resonator 100. Alternatively, the $\alpha$ value can be set at other values.

Figure 10:
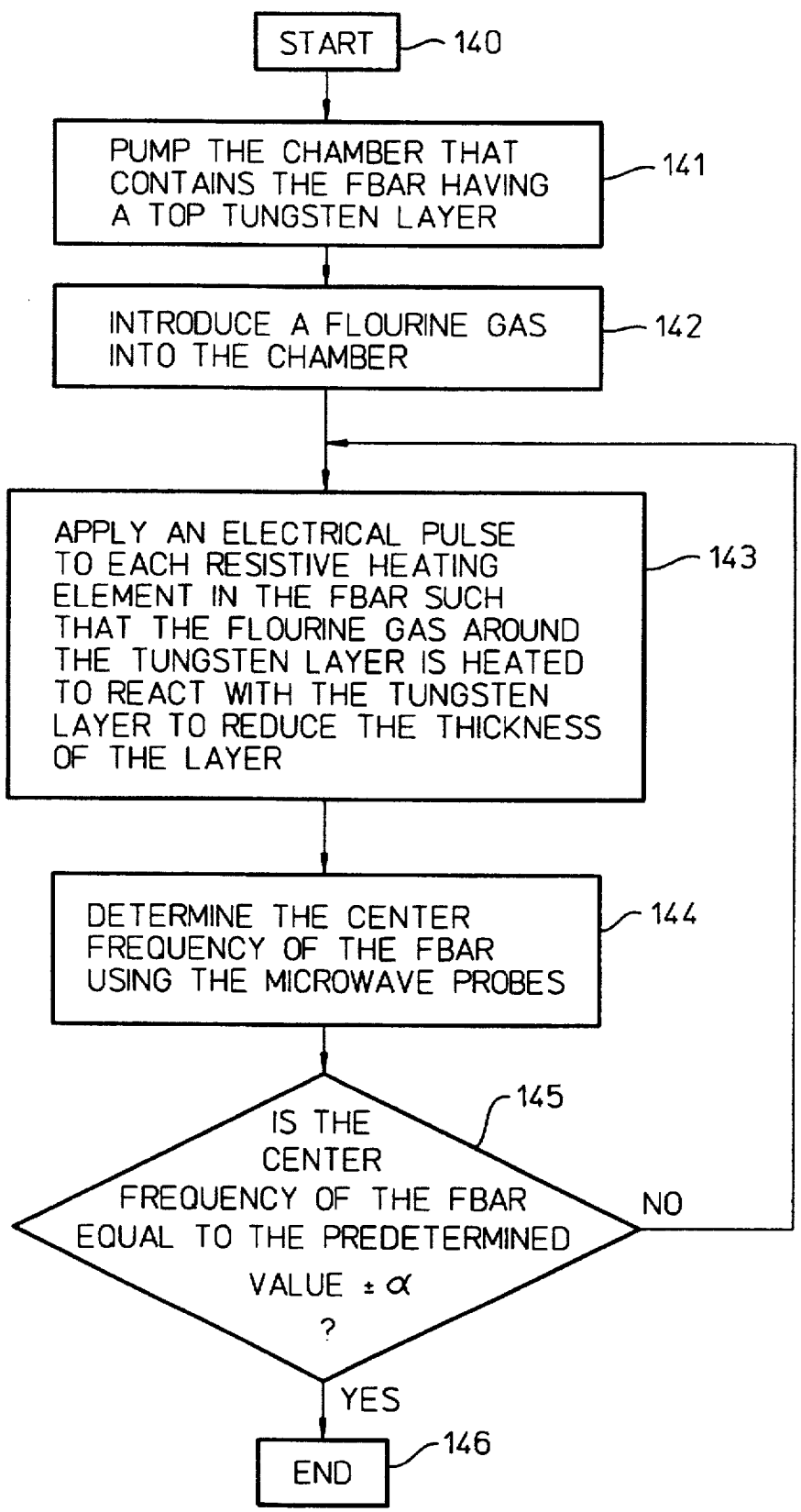
FIG. 10 is another flow chart diagram showing a process of etching the tuning layer by the system of FIG. 5 to tune the resonance frequency of the resonator.

FIG. 10 shows the etching reaction of the system 30 to decrease the thickness of the metal tuning layer 107. The etching process is now described in more detail below, using the $SF_6$ reaction gas as an example.

As can be seen from FIG. 10, the process starts at step 140. At step 141, the reaction chamber 32 of the system 30 is vacuumed to approximately 1 torr via the exhaust pipe 37. At step 142, a small amount of $SF_6$ gas is injected into the reaction chamber 32 via the input pipe 36. At this time, the temperature of the reaction chamber 32 is kept at approximately the room temperature and no reaction takes place.

Alternatively, the SF$_6$ gas is first sent to a pre-reaction or conditioning chamber (not shown in FIG. 5). Inside the pre-reaction chamber, the SF$_6$ gas is heated or struck with plasma to generate the reactive precursors of F, F$_2$, etc ... . The reactive precursors are then injected into the reaction chamber 32.

At step 143, the heater probes 40–41 contact the heating elements 103–104 of the resonator 100 for applying an electrical pulse to each of the resistive heating elements 103–104. The pulse causes the heating elements 103–104 to raise the temperature of the metal tuning layer 107 to the elevated temperature (e.g., 100° C.–200° C.) without significantly increasing the temperature of the surrounding areas of the resonator 100. As a result of the local heating, the SF$_6$ gas surrounding the metal tuning layer 107 is heated up to produce the reactive precursors of F, F$_2$, etc .... The reactive precursors of F and F$_2$ then react with the metal tuning layer 107 to form the metal-carrying fluoride (e.g., WF$_6$) gas which then volatilizes and evaporates away from the metal tuning layer 107. This reduces the thickness of the metal tuning layer 107. The reaction only takes place around the metal tuning layer 107 because the reaction requires the elevated temperature and the resonator 100 is only locally heated around the metal tuning layer 107 up to the elevated temperature. Again, the appropriate width of the electric pulse applied to the resistive heating elements 103–104 can be determined by measuring the resultant temperature at the metal tuning layer 107 during tests. The tests are performed prior to the tuning operation.

At step 144, the resonance frequency of the resonator 100 is measured by the frequency measuring circuit 52 using the probes 42–43. At step 145, the frequency measuring circuit 52 determines whether the measured resonance frequency is within the predetermined tolerance α of the desired frequency. If the answer is yes, then the process ends at step 146. If the answer is no, then the system 30 returns to step 143 to repeat the process.

Figure 11:
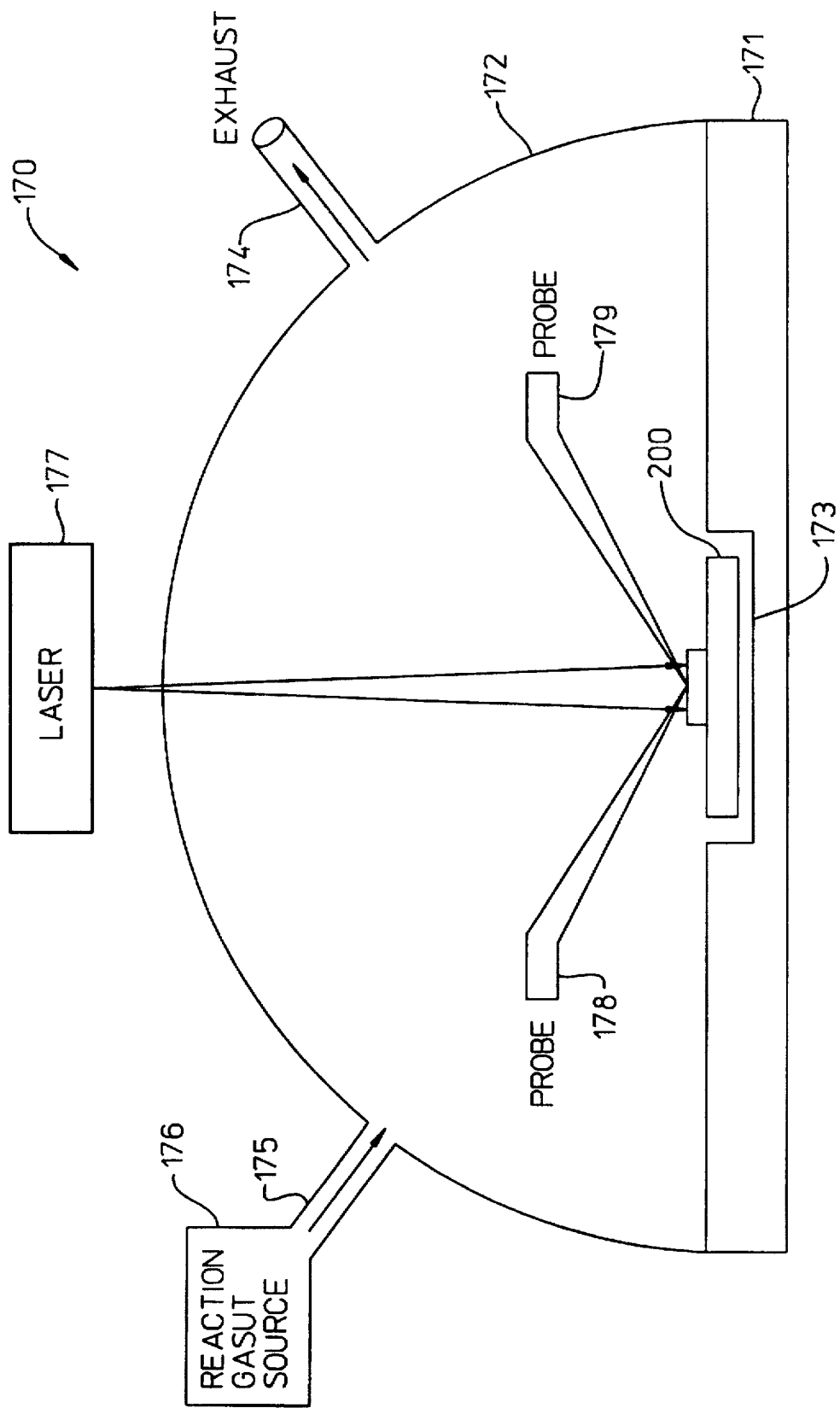
FIG. 11 shows another system of post-fabrication tuning the resonance frequency of an acoustic resonator in accordance with another embodiment of the present invention.
Figure 12:
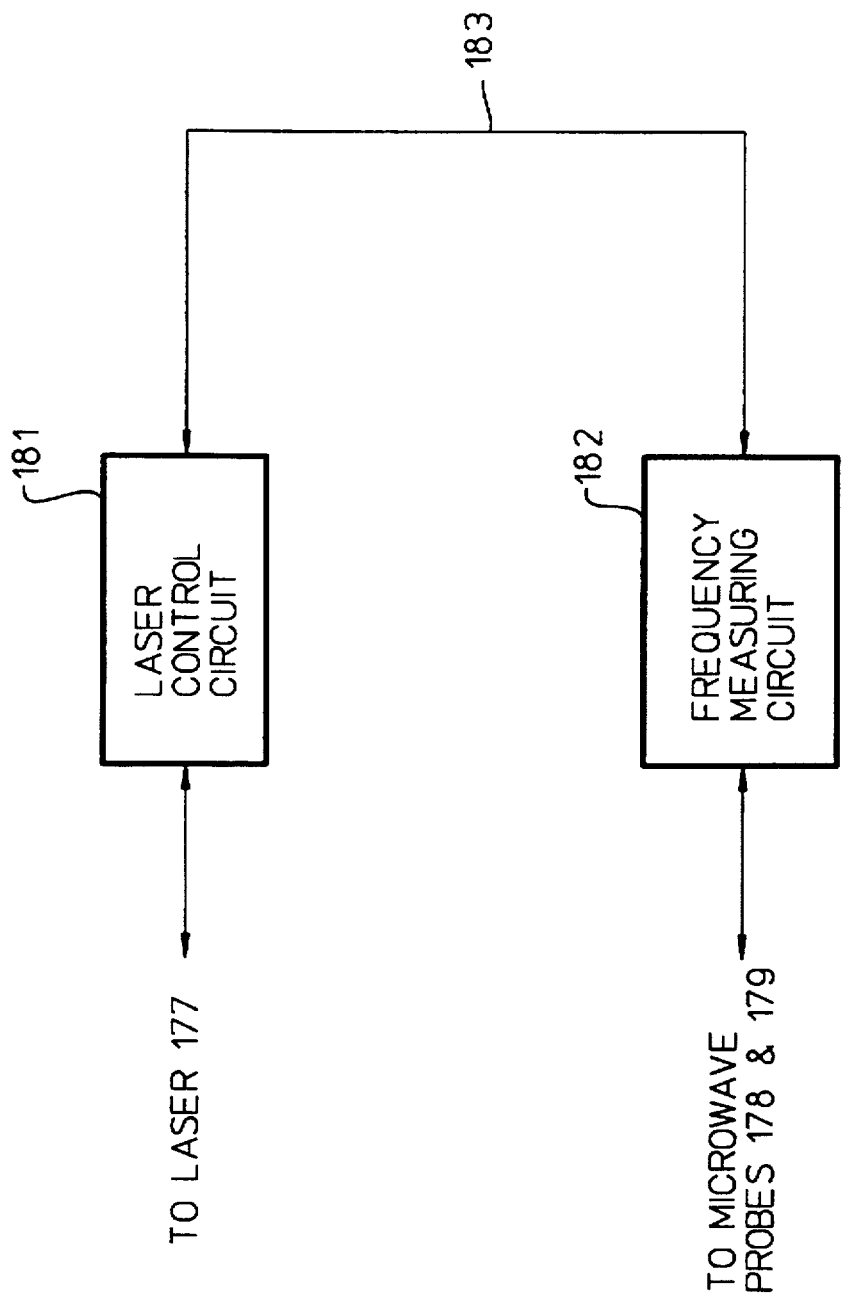
FIG. 12 is a block diagram of some circuits of the system of FIG. 11.

FIG. 11 shows another system 170 for tuning the resonance frequency of an acoustic resonator 200 to a desired frequency in accordance with another embodiment of the present invention. FIG. 12 shows some control circuits (i.e., a laser control circuit 181 and a frequency measuring circuit 182) of the system 170. The laser control circuit 181 and the frequency measuring circuit 182 can both be implemented by known circuits.

Figure 13:
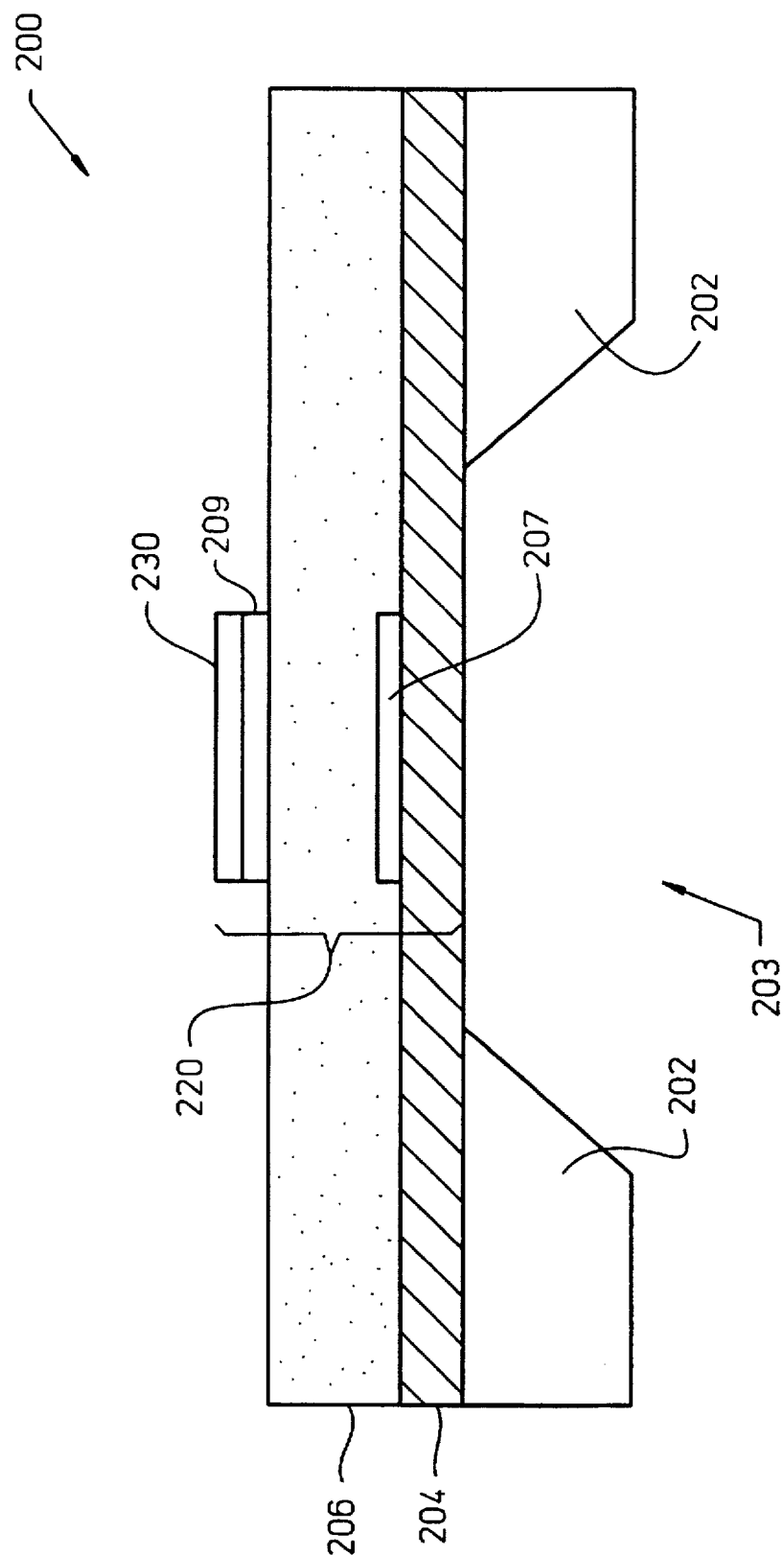
FIG. 13 is a cross-sectional view of the resonator of FIG. 11, showing the tuning layer of the resonator.

FIG. 13 is a cross-sectional view of the resonator 200. As can be seen from FIG. 13, the resonator 200 includes a substrate 202 with a cavity 203, a membrane 204, a PZ layer 206, a pair of electrode layers 207 and 209, and a metal tuning layer 230. The acoustic path 220 of the resonator 200 includes the metal tuning layer 230, the electrode layers 207–209, the PZ layer 206, and the membrane 204. As can be seen from FIGS. 7–8 and 13, the resonator 200 of FIG. 13 is identical to the resonator 100 of FIGS. 7–8, except the resonator 200 does not have any built-in resistive heating elements. Alternatively, the resonator 200 may include the built-in resistive heating elements.

As can be see from FIGS. 5–6 and 11–12, the system 170 of FIG. 11 is identical to the system 30 of FIG. 5, except that the system 170 employs a laser 177 to provide local heating for the resonator 200 and the laser control circuit 181 to control the laser 177. This causes the resonator 200 not to require any built-in resistive heating elements to provide the local heating. As can be seen from FIG. 11, the laser 177 is placed outside of the reaction chamber 172. In this case, the portion of the reaction chamber 172 that is between the laser 177 and the resonator 200 is transparent to light. In addition, that portion of the chamber 172 is also applied with an anti-reflective coating to allow the laser light from the laser 177 to shine through the transparent seal of the chamber 172 without loss of attenuation. Alternatively, the laser 177 can be placed inside the reaction chamber 172. In addition, the laser 177 that provides the local heating may be replaced with other known heating means.

Again, there are two power settings for the laser 177, namely—P$_1$ and P$_2$. P$_1$ indicates a power threshold value below which the light emitted from the laser 177 does not cause any decomposition. P$_2$ indicates a power threshold value above which the light emitted from the laser 177 causes blanket deposition. When the power received by the laser 177 is between P$_1$ and P$_2$, selective deposition occurs. For example, for a predetermined defocus and spot size, when the power setting is at approximately 200 mW, blanket deposition occurs on both the metal layer and the PZ layer. When the power setting is at approximately 100 mW, only selective deposition occurs. When, however, the power setting is reduced to approximately 50 mW, no deposition occurs. The power setting will vary for different spot size and defocus.

Figure 14:
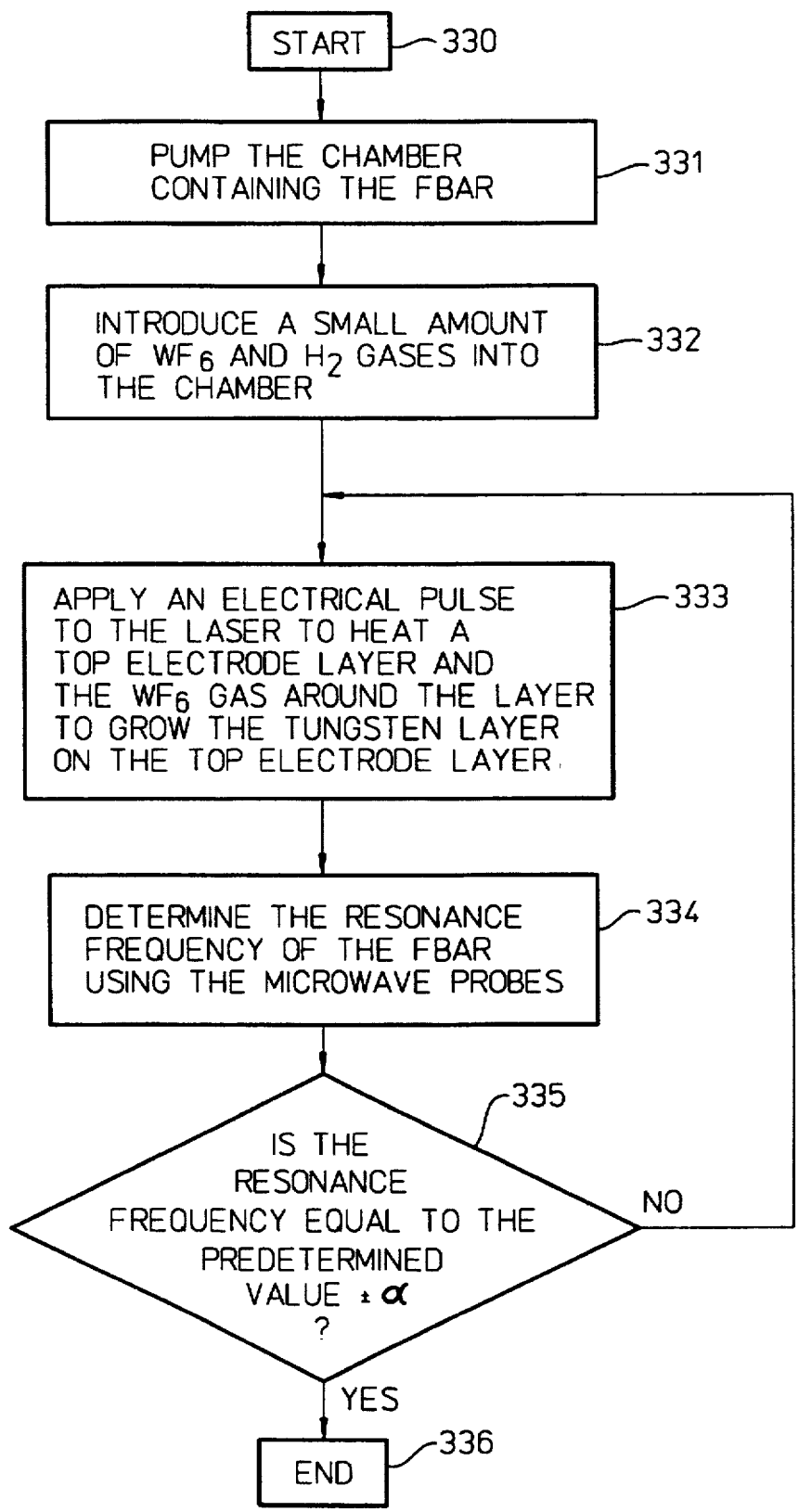
FIG. 14 is a flow chart diagram showing a process of growing the tuning layer by the system of FIG. 11 to tune the resonance frequency.
Figure 15:
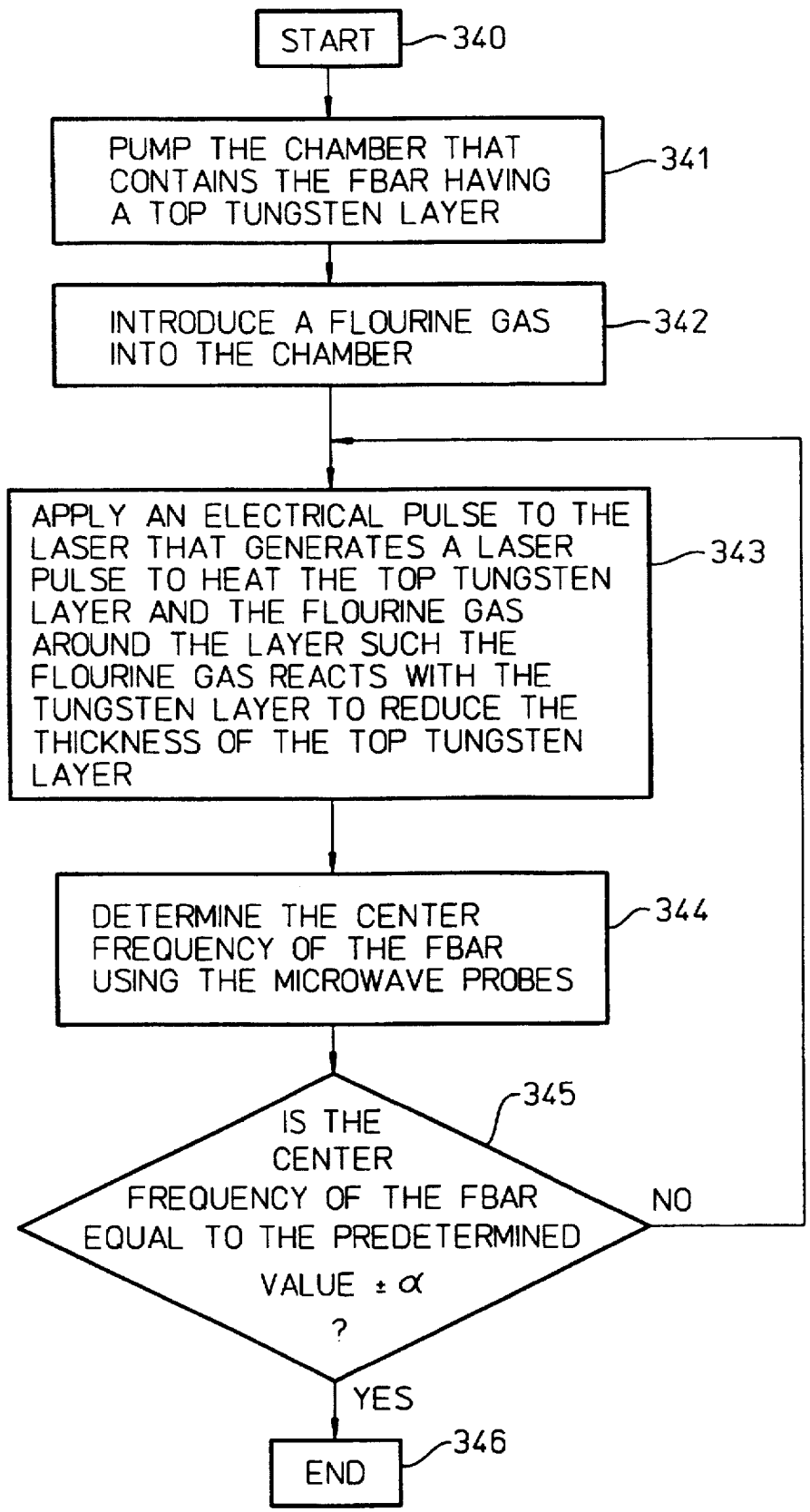
FIG. 15 is another flow chart diagram showing a process of etching the tuning layer by the system of FIG. 11 to tune the resonance frequency.

FIG. 14 shows the deposition process of the system 170 and FIG. 15 shows the etching process of the system 170. As can be seen from FIG. 14, the deposition process is substantially identical to the deposition process of FIG. 9, with the exception that the pulse is applied to the laser instead of the heating elements for the local heating at step 333. As can be seen from FIG. 15, the etching process is substantially identical to the etching process of FIG. 10, with the exception that the pulse is applied to the laser instead of the heating elements for the local heating at step 343.

In the foregoing specification, the invention has been described with reference to specific embodiments thereof. It will, however, be evident to those skilled in the art that various modifications and changes may be made thereto without departing from the broader spirit and scope of the invention. The specification and drawings are, accordingly, to be regarded in an illustrative rather than a restrictive sense.

What is claimed is:

1. A process of tuning a resonance frequency of a thin film acoustic resonator to a desired frequency after the resonator is fabricated, comprising the steps of:

(A) introducing a gas having at least a metal element into a substantial vacuum chamber that houses the resonator;

(B) heating an electrode layer of the resonator to an elevated temperature at which the gas adjacent to the electrode layer decomposes to selectively grow a metal layer on the electrode layer;

(C) controlling growth of the metal layer by controlling heating of the electrode layer such that an acoustic path of the resonator is adjusted to obtain the desired frequency.

2. The process of claim 1, wherein the gas is selected from a group comprising a platinum organo-metallic gas, a nickel organo-metallic gas, a yttrium organo-metallic gas, a silver organo-metallic gas, a palladium organo-metallic gas, and a tungsten hexafluoride (WF$_6$) gas.

3. The process of claim 1, wherein the resonator includes a plurality of resistive heating elements adjacent to the electrode layer, wherein the step (B) further comprises the steps of (I) connecting the resistive heating elements to an electric pulse generator;

(II) causing the electric pulse generator to apply an electric pulse of a predetermined width to each of the resistive heating elements to heat the electrode layer to the elevated temperature.

4. The process of claim 3, wherein the step (C) further comprises the steps of (i) measuring the resonance frequency of the resonator to determine if the resonance frequency is within a predetermined tolerance value of the desired frequency;

(ii) if the resonance frequency of the resonator does not fall within the predetermined tolerance value of the desired frequency, then causing the electric pulse generator to apply another electric pulse of the predetermined width to each of the resistive heating elements and returning to step (i).

5. The process of claim 1, wherein the step (B) further comprises the step of causing a laser generator to apply a laser pulse of a predetermined spot size and pulse duration to heat the electrode layer to the elevated temperature.

6. The process of claim 5, wherein the step (C) further comprises the steps of (a) measuring the resonance frequency of the resonator to determine if the resonance frequency is within a predetermined tolerance value of the desired frequency;

(b) if the resonance frequency of the resonator does not fall within the predetermined tolerance value of the desired frequency, then causing the laser generator to apply another laser pulse of the predetermined width to the electrode layer and returning to step (a).

7. The process of claim 1, wherein the lowest temperature of the elevated temperature is approximately between 50° C. and 150° C.

8. The process of claim 1, wherein the highest temperature of the elevated temperature is approximately between 200° C. and 350° C.

9. A process of tuning a resonance frequency of a thin film acoustic resonator to a desired frequency after the resonator is fabricated, comprising the steps of:

(A) introducing a reaction gas into a substantial vacuum chamber that houses the acoustic resonator that has a metal tuning layer;

(B) heating the metal tuning layer to an elevated temperature at which the reaction gas adjacent to the metal tuning layer reacts with the metal tuning layer to etch the metal tuning layer while causing temperature of adjacent area of the acoustic resonator not to reach the elevated temperature, wherein the step (B) further comprises the step of causing a laser generator to apply a laser pulse of a predetermined spot size and pulse duration to heat the metal tuning layer to the elevated temperature;

(C) controlling etching of the metal tuning layer by controlling heating of the metal tuning layer such that an acoustic path of the resonator is adjusted to a desired length that corresponds to the desired frequency.

10. The process of claim 9, wherein the metal tuning layer is selected from a group of metals comprising tungsten, aluminum, and molybdenum, wherein the reaction gas is one of a fluorine-carrying gas and a chlorine-carrying gas.

11. The process of claim 10, wherein the fluorine-carrying gas is selected from a group comprising a nitrogen trifluoride ($NF_3$) gas, a carbon tetrafluoride ($CF_4$) gas, and a sulphur hexafluoride ($SF_6$) gas, wherein the chlorine-carrying gas is selected from a group comprising a boron trichloride ($BCl_3$) gas and a chlorine gas ($Cl_2$).

12. The process of claim 9, wherein the step (C) further comprises the steps of (a) measuring the resonance frequency of the resonator to determine if the resonance frequency is within a predetermined tolerance value of the desired frequency;

(b) if the resonance frequency of the resonator does not fall within the predetermined tolerance value of the desired frequency, then causing the laser generator to apply another laser pulse of the predetermined width to the metal tuning layer and returning to step (a).

13. The process of claim 9, wherein the lowest temperature of the elevated temperature is approximately between 50° C. and 150° C.

14. The process of claim 9, wherein the highest temperature of the elevated temperature is approximately between 200° C. and 350° C.

15. A system for tuning a resonance frequency of a thin film acoustic resonator to a desired frequency after the resonator is fabricated, comprising:

(A) a substantial vacuum reaction chamber within which the resonator is located, the resonator having a metal layer in an acoustic path of the resonator;

(B) a heater that heats the metal layer to an elevated temperature at which the thickness of the metal layer is adjusted depending on a reaction gas introduced into the reaction chamber while causing temperature of adjacent area of the acoustic resonator not to reach the elevated temperature, wherein the heater is a laser generator that is placed to aim at the metal layer and, whenever triggered, generates a laser pulse of a predetermind spot size and pulse duration;

(C) a control circuit that controls the heater to heat the metal layer to adjust the thickness of the metal layer until the desired frequency for the resonator is obtained.

16. The system of claim 15, wherein the laser generator has a lowest power setting and a highest power setting.

17. The system of claim 15, wherein the control circuit further comprises (I) a frequency measuring circuit that measures the resonance frequency of the resonator;

(II) a laser control circuit coupled to the laser generator and the frequency measuring circuit, the laser control circuit causing the laser generator to generate the laser pulse until the resonance frequency measured by the frequency measuring circuit is within a predetermined tolerance value of the desired frequency.

18. The system of claim 15, wherein the elevated temperature has a lowest temperature that is approximately between 50° C. and 150° C. and a highest temperature that is approximately between 200° C. and 350° C.

19. The system of claim 15, wherein the metal layer is an electrode layer of the resonator and is made of a metal selected from a group comprising tungsten, aluminum, titanium, and molybdenum, wherein the reaction gas is selected from a group comprising a platinum organo-metallic gas, a nickel organo-metallic gas, a yttrium organo-metallic gas, a silver organo-metallic gas, a palladium organo-metallic gas, and a tungsten hexafluoride ($WF_6$) gas.

20. The system of claim 15, wherein the metal layer is a metal tuning layer deposited on an electrode layer of the resonator during fabrication of the resonator and is made of a metal selected from a group comprising tungsten, aluminum, titanium, and molybdenum, wherein the reaction gas is one of a fluorine-carrying gas and a chlorine-carrying gas.

21. The system of claim 20, wherein the fluorine-carrying gas is selected from a group comprising a nitrogen trifluoride ($NF_3$)gas, a carbon tetrafluoride ($CF_4$) gas, and a sulphur hexafluoride ($SF_6$) gas, wherein the chlorine-carrying gas is selected from a group comprising a boron trichloride ($BCl_3$) gas and a chlorine gas ($Cl_2$).

* * * * *